(12) United States Patent
Wu

(10) Patent No.: US 9,740,664 B2
(45) Date of Patent: Aug. 22, 2017

(54) METHOD FOR DETERMINING PARAMETER VALUES OF AN INDUCTION MACHINE BY MEANS OF POLYNOMINAL CALCULATIONS

(71) Applicant: I-SHOU UNIVERSITY, Kaohsiung (TW)

(72) Inventor: Rong-Ching Wu, Kaohsiung (TW)

(73) Assignee: I-SHOU UNIVERSITY, Kaohsiung (TW)

( * ) Notice: Subject to any disclaimer, the term of this patent is extended or adjusted under 35 U.S.C. 154(b) by 0 days.

(21) Appl. No.: 14/956,334

(22) Filed: Dec. 1, 2015

(65) Prior Publication Data

US 2017/0075861 A1 Mar. 16, 2017

(30) Foreign Application Priority Data

Sep. 14, 2015 (TW) .............................. 104130288 A

(51) Int. Cl.
*H02P 21/00* (2016.01)
*H02P 23/00* (2016.01)
(Continued)

(52) U.S. Cl.
CPC .................................. *G06F 17/156* (2013.01)

(58) Field of Classification Search
CPC ........ H02P 23/14; H02P 29/66; H02P 29/664; H02P 21/00; H02P 21/16; H02P 21/22;
(Continued)

(56) References Cited

U.S. PATENT DOCUMENTS

| 3,679,924 A | * | 7/1972 | Menzies | ................ H02K 19/14 310/163 |
| 4,207,510 A | * | 6/1980 | Woodbury | ................ H02P 6/08 318/802 |

(Continued)

OTHER PUBLICATIONS

Rong-Ching Wu, "Method for determining complete parameter values of an induction machine by parameter of time varying", Search & Discovery Research at ISU & EDH. Summer 2012, pp. 14-20, vol. 14, I-Shou University, Taiwan.
(Continued)

*Primary Examiner* — Paul Ip
(74) *Attorney, Agent, or Firm* — WPAT, P.C., Intellectual Property Attorneys; Anthony King

(57) ABSTRACT

A method for determining parameter values of an induction machine. The method may be executed by a dedicated computer system. The method includes sampling a voltage signal, a current signal and a rotational speed signal of the induction machine at the time the induction machine is started, calculating a resistance and a reactance of the induction machine at each of a plurality of slip rates according to the voltage signal and the current signal, calculating a plurality of coefficients of a polynomial fraction based on the resistances and the reactances, calculating the parameter values of an equivalent circuit according to the plurality of coefficients of the polynomial fraction, calculating a moment of inertia and a friction coefficient of the induction machine according to the calculated parameter values and the rotational speed signal of the equivalent circuit, and outputting the moment of inertia and the friction coefficient of the induction machine.

9 Claims, 6 Drawing Sheets

(51) Int. Cl.
*H02P 25/00* (2006.01)
*G06F 17/15* (2006.01)

(58) Field of Classification Search
CPC ...... H02P 2207/01; H02P 23/03; H02P 23/08;
H02P 25/024; H02P 27/047; H02P 27/08;
H02P 6/08; H02P 6/182; G01R 31/343
USPC ........................................ 318/806, 798, 490
See application file for complete search history.

(56) References Cited

U.S. PATENT DOCUMENTS

| | | | | |
|---|---|---|---|---|
| 4,947,332 A * | 8/1990 | Ghoneim | ................ | B60T 8/172 180/197 |
| 5,388,052 A * | 2/1995 | Mann | ........................ | B66B 1/30 187/391 |
| 5,619,435 A * | 4/1997 | Prakash | ............... | G06F 17/5009 318/800 |
| 5,671,143 A * | 9/1997 | Graber | ................ | B60T 8/1755 303/150 |
| 5,671,982 A * | 9/1997 | Wanke | ................ | B60T 8/17551 303/146 |
| 5,694,321 A * | 12/1997 | Eckert | ................... | B60T 8/1755 180/197 |
| 5,710,704 A * | 1/1998 | Graber | ................ | B60W 10/184 180/197 |
| 5,710,705 A * | 1/1998 | Eckert | ................ | B60T 8/17551 180/197 |
| 5,711,023 A * | 1/1998 | Eckert | ................ | B60T 8/17551 303/146 |
| 5,711,024 A * | 1/1998 | Wanke | ................... | B60T 8/1755 180/197 |
| 5,711,025 A * | 1/1998 | Eckert | ................ | B60T 8/17551 180/197 |
| 5,732,377 A * | 3/1998 | Eckert | ................... | B60T 8/1755 303/140 |
| 5,742,507 A * | 4/1998 | Eckert | ................... | B60K 31/00 180/197 |
| 5,762,406 A * | 6/1998 | Yasui | ................... | B60T 8/1755 303/113.5 |
| 5,774,821 A * | 6/1998 | Eckert | ................... | B60T 8/1755 303/140 |
| 5,857,754 A * | 1/1999 | Fukami | ................ | B60T 8/1764 303/140 |
| 5,862,503 A * | 1/1999 | Eckert | ................... | B60T 8/1755 303/140 |
| 5,869,943 A * | 2/1999 | Nakashima | ......... | B60T 8/17554 303/146 |
| 5,913,578 A * | 6/1999 | Tozu | ..................... | B60T 8/1755 303/140 |
| 5,927,830 A * | 7/1999 | Tozu | ........................ | B60T 8/173 303/155 |
| 5,964,819 A * | 10/1999 | Naito | ..................... | B62D 7/159 303/140 |
| 6,456,920 B1 * | 9/2002 | Nishio | ................ | B60T 8/17551 303/140 |
| 6,473,682 B1 * | 10/2002 | Nakamura | ............... | B60T 8/172 152/209.2 |
| 6,549,842 B1 * | 4/2003 | Hac | ........................ | B60T 8/172 303/149 |
| 6,556,911 B2 * | 4/2003 | Matsuno | ................ | B60T 8/172 180/422 |
| 6,862,538 B2 * | 3/2005 | El-Ibiary | ................ | G01R 31/34 702/38 |
| 7,135,830 B2 * | 11/2006 | El-Ibiary | ............... | H02P 29/664 318/560 |
| 7,171,296 B2 * | 1/2007 | Kato | ........................ | B60T 8/172 303/146 |
| 7,184,902 B2 * | 2/2007 | El-Ibiary | ................ | H02P 23/14 702/60 |
| 7,440,834 B2 * | 10/2008 | Yamaguchi | .......... | B60K 17/356 180/233 |
| 7,960,928 B2 * | 6/2011 | Tang | ..................... | B60L 15/025 318/400.02 |
| 8,140,291 B2 * | 3/2012 | Kasztenny | ............. | G01R 31/34 318/490 |
| 8,170,768 B2 * | 5/2012 | Fujimoto | .................. | B60L 3/10 701/90 |
| 8,244,432 B2 * | 8/2012 | Kogure | ............... | B60W 40/068 180/197 |
| 8,483,926 B2 * | 7/2013 | Shiozawa | ................. | B60L 3/10 303/150 |
| 8,519,651 B2 * | 8/2013 | Hernandez Ferrusca | .................. | H02P 23/08 318/400.13 |
| 8,676,524 B2 * | 3/2014 | Wu | ......................... | H02P 23/14 318/727 |
| 2002/0011093 A1 * | 1/2002 | Matsuno | ................. | B60T 8/172 73/9 |
| 2002/0111752 A1 * | 8/2002 | Nakamura | ............... | B60T 8/172 702/42 |
| 2002/0149341 A1 * | 10/2002 | Tao | ......................... | H02P 6/182 318/798 |
| 2004/0019439 A1 * | 1/2004 | El-Ibiary | ................ | G01R 31/34 702/57 |
| 2005/0067991 A1 * | 3/2005 | El-Ibiary | ................ | H02P 29/664 318/490 |
| 2005/0071095 A1 * | 3/2005 | El-Ibiary | ................. | H02P 23/14 702/60 |
| 2005/0125131 A1 * | 6/2005 | Kato | ....................... | B60T 8/172 701/70 |
| 2005/0125135 A1 * | 6/2005 | Fujioka | .................... | B62D 6/04 701/70 |
| 2006/0015236 A1 * | 1/2006 | Yamaguchi | .......... | B60K 17/356 701/69 |
| 2007/0118307 A1 * | 5/2007 | El-Ibiary | ................ | H02P 23/14 702/60 |
| 2007/0118308 A1 * | 5/2007 | El-Ibiary | ................ | H02P 23/14 702/60 |
| 2008/0133066 A1 * | 6/2008 | Takenaka | ........... | B60G 17/0195 701/1 |
| 2008/0262692 A1 * | 10/2008 | Kogure | ................ | B60W 40/068 701/90 |
| 2009/0210128 A1 * | 8/2009 | Fujimoto | .................. | B60L 3/10 701/84 |
| 2010/0090629 A1 * | 4/2010 | Tang | ..................... | B60L 15/025 318/400.09 |
| 2010/0114447 A1 * | 5/2010 | Moriki | ................... | B60K 6/442 701/74 |
| 2010/0114449 A1 * | 5/2010 | Shiozawa | ................. | B60L 3/10 701/90 |
| 2010/0194324 A1 * | 8/2010 | Kasztenny | ............. | G01R 31/34 318/490 |
| 2011/0209521 A1 * | 9/2011 | Shiozawa | ................. | B60L 3/102 73/9 |
| 2011/0276301 A1 * | 11/2011 | Wu | ......................... | H02P 23/14 702/115 |
| 2012/0016646 A1 * | 1/2012 | Takenaka | ................ | B60T 8/172 703/2 |
| 2012/0029783 A1 * | 2/2012 | Takenaka | ................ | B60T 8/172 701/73 |
| 2012/0270325 A1 * | 10/2012 | Sperry | ................ | F04D 15/0088 436/43 |
| 2012/0279793 A1 * | 11/2012 | Kikuchi | ................... | B60T 8/175 180/197 |
| 2015/0298577 A1 * | 10/2015 | Kobayashi | ............. | B60L 15/20 701/22 |

OTHER PUBLICATIONS

English abstract translation of "Method for determining complete parameter values of an induction machine by parameter of time varying".

* cited by examiner

METHOD FOR DETERMINING PARAMETER VALUES OF AN INDUCTION MACHINE BY MEANS OF POLYNOMINAL CALCULATIONS

CROSS REFERENCE TO RELATED APPLICATIONS

The application claims the benefit of Taiwan application serial No. 104130288, filed on Sep. 14, 2015, and the subject matter of which is incorporated herein by reference.

BACKGROUND OF THE INVENTION

1. Field of the Invention

The present invention generally relates to a method for determining the parameter values of an induction machine and, more particularly, to a method for determining the parameter values of an induction machine by means of polynomial calculations.

2. Description of the Related Art

Induction machines have been widely used for industrial control purposes. For example, a three-phase induction machine uses a three-phase winding as the stator, and the rotor does not require a circuit that generates direct current (DC) magnetic field. In this regard, the voltage, current and rotational torque of the rotor can be generated under the relative rotation between the stator and the rotor. In the above, the structure of the induction machine is simple and the operation thereof is convenient. Thus, the induction machines have become the commonly used alternating current (AC) electric motors. In the precision control technology, the induction machines not only provide the required power for the associated apparatuses but also serve a main role in controlling said apparatuses.

A conventional method for controlling an induction machine needs to be perform via an equivalent model (such as a steady state model and a dynamic state model). There are two approaches in determining the parameter values of the induction machine, which are off-line parameter determination and on-line parameter determination. In the off-line parameter determination, the parameter values of the induction machine are determined in an off-line mode of the induction machine. An example of off-line parameter determination is the standard IEEE 112 test which determines the parameter values of an equivalent circuit of the induction machine via a stator DC test, a lock-rotor test and an off-load starting test. On the other hand, in the on-line parameter determination, the associated equipment and controller are required, and the DC signals are used to determine the resistance of the stator via a self-adjusted procedure when the induction machine is on-load. Other parameter values of the induction machine can be determined.

However, some problems will be encountered when determining the parameter values of the induction machine. Specifically, it is inevitable that the signals always contain noise, which affects the calculation accuracy of the parameter values. In addition, the actual system is much more complex than the linear mode, adversely resulting in an error. In light of this, a larger number of times of iteration operations can be used to solve the above problems. However, this requires an initial value, and the calculation complexity is high. As such, the calculated result may be in a local optimum rather than an optimal solution.

In light of this, it is necessary to improve the conventional method by eliminating the use of the initial value and by reducing the calculation complexity.

SUMMARY OF THE INVENTION

It is therefore the objective of this invention to provide a novel method for determining the parameter values of an induction machine by means of polynomial calculations, which does not require the initial value and is able to determine the optimal solutions via just one time of calculation. Thus, the calculation complexity can be reduced.

In an embodiment, a method for determining the parameter values of an induction machine by means of polynomial calculations is disclosed. The method can be performed by a dedicated computer system. The method includes sampling a voltage signal, a current signal and a rotational speed signal of the induction machine at the time the induction machine is started, calculating a resistance and a reactance of the induction machine at each of a plurality of slip rates according to the voltage signal and the current signal, calculating a plurality of coefficients of a polynomial fraction based on the resistances and the reactances; calculating the parameter values of an equivalent circuit according to the plurality of coefficients of the polynomial fraction, calculating a moment of inertia and a friction coefficient of the induction machine according to the calculated parameter values and the rotational speed signal of the equivalent circuit, and outputting the moment of inertia and the friction coefficient of the induction machine.

In a form shown, the equivalent circuit includes a stator resistance, a stator reactance and a magnetizing reactance that are connected in series to form an open loop. The equivalent circuit further includes a rotor reactance and a rotor resistance that are connected to two ends of the magnetizing reactance to form a closed loop.

In the form shown, the polynomial fraction is expressed as $$R + jX = \frac{(\beta_0 + \beta_1 S + \beta_2 S^2) + j(\beta_3 + \beta_4 S^2)}{1 + \alpha_2 S^2},$$

wherein, $\alpha_2 = (X_m + X_r)^2 / R_r^2$ $\beta_0 = R_S$ $\beta_1 = X_m^2 / R_r$ $\beta_2 = R_S (X_m + X_r)^2 / R_r^2$ $\beta_3 = X_m + X_S$ $\beta_4 = [(X_m + X_r)^2 (X_m + X_S) - X_m^2 (X_m + X_r)]$ wherein "R" is the resistance of a primary side of the induction machine, "X" is the reactance of the primary side of the induction machine, "S" is the slip rates, "Xm" is the magnetizing reactance, "Xr" is the rotor reactance, "Xs" is a stator reactance, "Rr" is the rotor resistance, and "Rs" is the stator resistance.

In the form shown, the magnetizing reactance, the rotor reactance and the stator reactance have a predetermined ratio $$\eta = \frac{X_m + X_r}{X_m + X_S}.$$

In the form shown, the predetermined ratio is between 0.95 and 1.05.

In the form shown, the magnetizing reactance is expressed as $$X_m = \sqrt{\frac{\eta \beta_3 (\alpha_2 \beta_3 - \beta_4)}{\alpha_2}}.$$

In the form shown, the stator reactance is expressed as $X_S = \beta_3 - X_m$.

In the form shown, the rotor reactance is expressed as $X_r = \eta(X_m + X_S) - X_m = \eta \beta_3 - X_m$.

In the form shown, the rotor resistance is expressed as $R_r = X_m^2 / \beta_1$.

In the form shown, the stator resistance is expressed as $$R_S = \frac{\beta_0 + \beta_2 S^2}{1 + \alpha_2 S^2}.$$

In the form shown, the moment of inertia and the friction coefficient are expressed as:

$$\begin{bmatrix} J \\ B \end{bmatrix} = \begin{bmatrix} \sum_{n=0}^{N-1} (\omega_r(n) - \omega_r(n-1))^2 & \sum_{n=0}^{N-1} \omega_r(n)(\omega_r(n) - \omega_r(n-1)) \\ \sum_{n=0}^{N-1} \omega_r(n)(\omega_r(n) - \omega_r(n-1)) & \sum_{n=0}^{N-1} (\omega_r(n))^2 \end{bmatrix}^{-1}$$

$$\begin{bmatrix} \sum_{n=0}^{N-1} T(n)(\omega_r(n) - \omega_r(n-1)) \\ \sum_{n=0}^{N-1} T(n)\omega_r(n) \end{bmatrix}$$

wherein $\omega(n)$ and $\omega(n-1)$ are angular velocities at different discrete time frames, wherein $T(n)$ is a discrete rotational torque, and wherein "n" is a serial number of discrete data and is 0, 1, 2 . . . and so on.

The above method for determining the parameter values of the induction machine does not require any initial value and is able to determine the optimal values via one-off calculation procedure. As such, the calculation complexity is reduced and high reliability and accuracy is achieved. Advantageously, the user is able to predict the parameter values and the operational condition of the induction machine, improving the reliability and accuracy of the precision control technology.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
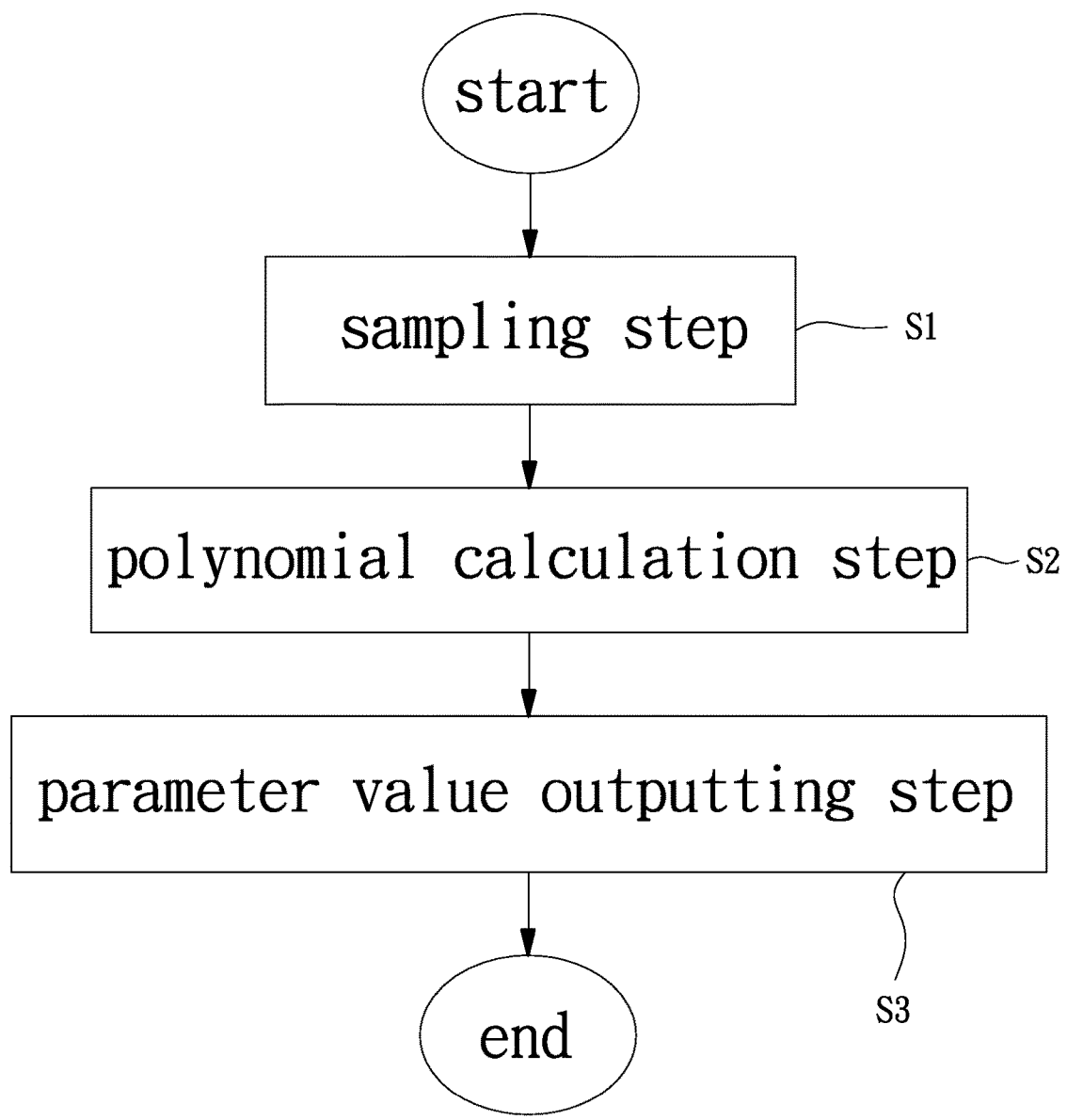
FIG. 1 shows a flowchart of a method for determining the parameter values of an induction machine by means of polynomial calculations according to an embodiment of the invention.

In the various figures of the drawings, the same numerals designate the same or similar parts. Furthermore, when the terms "first", "second", "third", "fourth", "inner", "outer", "top", "bottom", "front", "rear" and similar terms are used hereinafter, it should be understood that these terms have reference only to the structure shown in the drawings as it would appear to a person viewing the drawings, and are utilized only to facilitate describing the invention.

DETAILED DESCRIPTION OF THE INVENTION

The term "slip rate" referred hereinafter is a ratio of a rotational speed difference to a synchronous rotational speed of a rotating magnetic field of an induction machine, in which the rotational speed difference is the difference between an actual rotational speed and the synchronous rotational speed of the induction machine, as it can be readily appreciated by the persons having ordinary skill in the art.

FIG. 1 shows a flowchart of a method for determining parameters of an induction machine by means of polynomial calculations according to an embodiment of the invention. The method can be performed by a computer system to execute a program for determining the mechanical parameters of an induction machine, such as the moment of inertia and the friction coefficient of a three-phase inductive electric motor. The computer system is dedicated for simulating the induction machine. As such, the accuracy of the computer system in simulating the induction machine can be improved, and the initial value is not required. In addition, the method of the embodiment of the invention is able to determine the optimal solution via one-off calculation procedure, thereby reducing the calculation complexity. Advantageously, the performance of the dedicated computer system can be improved. In the embodiment, after the induction machine is started, a measuring instrument can be used to measure the time-varying voltage, current and rotational speed of the induction machine during which the induction machine transfers from the initial state to the steady state. Furthermore, the time-varying voltage, current and rotational speed may have the same sampling scale, and the time-varying voltage and current can be analyzed under time domain to obtain the amplitude and phase at each sampling scale. Accordingly, the equivalent resistance and reactance of the primary side of the induction machine at every sampling point can be obtained. Moreover, the slip rate at each sampling point can be determined from the rotational speeds at the individual sampling points. Thus, a relation curve between the resistance and the slip rate, as well as another relation curve between the reactance and the slip rate, can be obtained under the same sampling scale. The method of the embodiment of the invention may include a sampling step S1, a polynomial calculation step S2 and a parameter value outputting step S3.

Referring to FIG. 1, the sampling step S1 is configured to sample a voltage signal, a current signal and a rotational speed signal of the induction machine at the time the induction machine is started, and to calculate the resistance and the reactance of the induction machine under different slip rates based on the sampled voltage and current signals, as elaborated below.

For example, since the transient time constant of the induction machine is small, the transient value caused by the inductor will rapidly reduce to an ignorable range in the early stage of the start. As such, the voltage and current characteristics are determined primarily by the steady state impedance.

Figure 2:
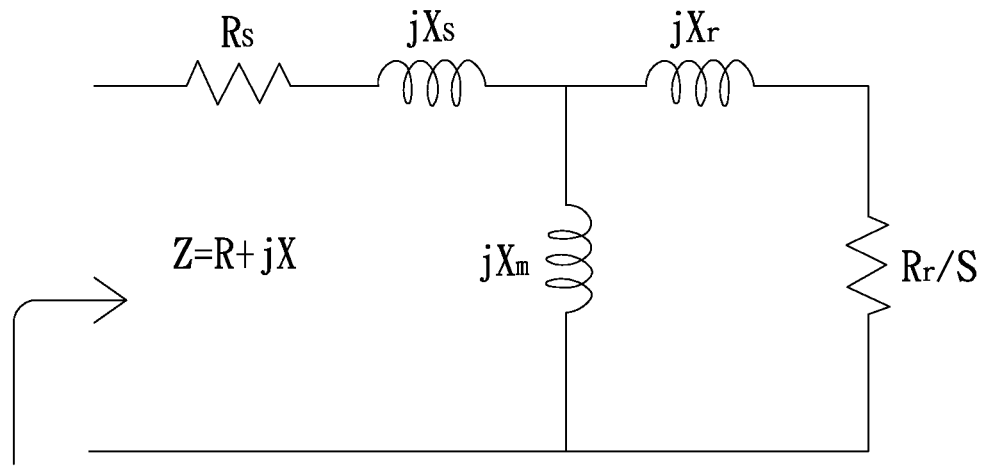
FIG. 2 shows a diagram of an equivalent circuit of the induction machine under the steady state according to the embodiment of the invention.

FIG. 2 shows a diagram of an equivalent circuit of the induction machine under the steady state according to the embodiment of the invention. The equivalent circuit may include a stator resistance Rs, a stator reactance Xs and a magnetizing reactance Xm, which are connected in series to form an open loop. The equivalent circuit further includes a rotor reactance Xr and a per slip rotor resistance Rr/S, which are connected to the magnetizing reactance Xm to form a closed loop. The symbol "S" refers to the slip rate. Based on this, the impedance of the primary side of the induction machine can be expressed as a formula (1) below:

$$R + jX = R_S + jX_s + \frac{jX_m(R_r/S + jX_r)}{jX_m + (R_r/S + jX_r)}. \qquad (1)$$

In the above formula (1), "R" is the resistance of the primary side of the induction machine, "X" is the reactance of the primary side of the induction machine, "Rs" is the stator resistance, "Xs" is the stator reactance, "Xm" is the magnetizing reactance, "Xr" is the rotor reactance, and "Rr/S" is the per slip rotor resistance.

In the above formula (1), both the resistance and the reactance can be represented as a function of the slip rate "S," as expressed in formulas (2) and (3) below:

$$R(S) = R_S + \frac{X_m^2 R_r/S}{(R_r/S)^2 + (X_m + X_r)^2}. \qquad (2)$$

$$X(S) = X_S + X_m - \frac{X_m^2(X_m + X_r)}{(R_r/S)^2 + (X_m + X_r)^2}. \qquad (3)$$

Figure 3:
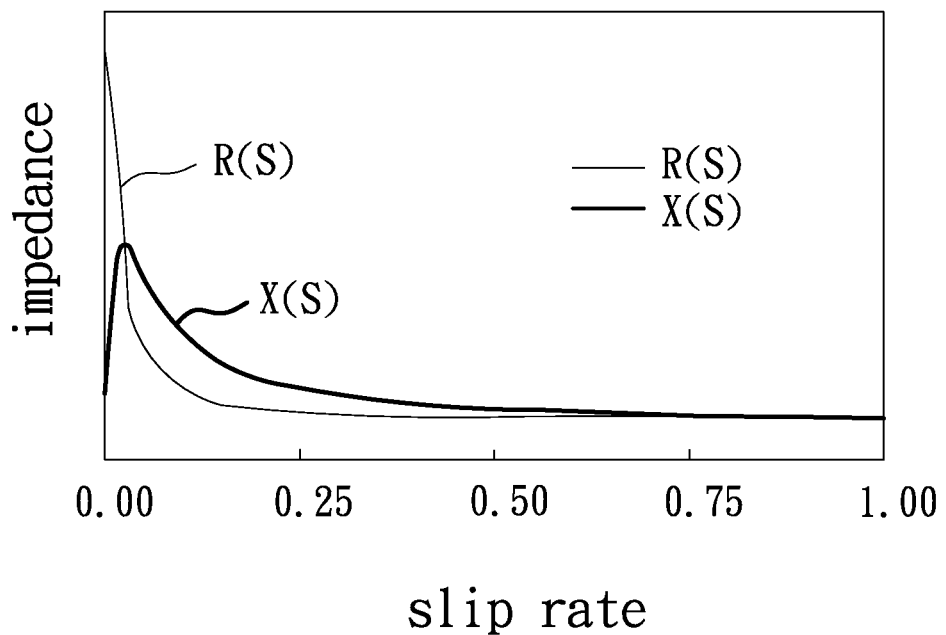
FIG. 3 shows a relation curve of an impedance of the induction machine during which the induction machine transfers from a stationary state to a synchronous rotational speed state.

It can be known from the above formulas (2) and (3) that the per slip rotor resistance "Rr/S" is the only factor in the resistance and the reactance that is affected by the slip rate "S." As a result, the resistance and reactance becomes a time-varying impedance. When the induction machine transfers from the stationary state into a synchronous rotational speed state, the slip rate changes from 1 to 0. The relation curves of the resistance and the reactance may be seen in FIG. 3. Specifically, the relation curve of the reactance X(S) appears to always decline as the slip rate changes from 0 to 1. At the time of start up (the slip rate reduces from 1, see the right side of FIG. 3), the reactance X(S) appears to be flat without change (at the right side of FIG. 3), whereas the resistance R(S) appears to increase in a linear manner and then reaches a maximum value at about the synchronous rotational speed. The relation curves of the resistance R(S) and the reactance X(S) will intersect at about the synchronous rotational speed. The resistance R(S) will reduce rapidly as the slip rate continues to decline.

Referring to FIG. 1 again, based on the resistance R(S) and the reactance X(S), the polynomial calculation step S2 may calculate a coefficient for a polynomial fraction. The detail is described below, but it is not taken as a limited sense.

For example, the above formulas (2) and (3) can be rewritten into polynomial fraction, and the resistance and the reactance of the primary side of the induction machine may be expressed as formulas (4) and (5) below:

$$R = \frac{R_S + SX_m^2 R_r + S^2 R_S (X_m + X_r)^2 / R_r^2}{1 + S^2 (X_m + X_r)^2 / R_r^2}. \qquad (4)$$

$$X = \frac{(X_m + X_S)}{1 + S^2(X_m + X_r)^2 / R_r^2} + \qquad (5)$$
$$\frac{S^2[(X_m + X_r)^2(X_m + X_S) - X_m^2(X_m + X_r)]/R_r^2}{1 + S^2(X_m + X_r)^2/R_r^2}.$$

The above formulas (4) and (5) can be expressed as a polynomial fraction, as shown in a formula (6) below:

$$R + jX = \frac{(\beta_0 + \beta_1 S + \beta_2 S^2) + j(\beta_3 + \beta_4 S^2)}{1 + \alpha_2 S^2}. \qquad (6)$$

$$\alpha_2 = (X_m + X_r)^2 / R_r^2 \qquad (7)$$
$$\beta_0 = R_S$$
$$\beta_1 = X_m^2 / R_r$$
$$\beta_2 = R_S(X_m + X_r)^2 / R_r^2$$
$$\beta_3 = X_m + X_S$$
$$\beta_4 = [(X_m + X_r)^2(X_m + X_S) - X_m^2(X_m + X_r)].$$

Based on the above, since the regression analysis of the polynomial fraction is able to express the relation between the independent variable and the dependent variable of a polynomial fraction, a minimum error can be determined. As such, the predicted value will be more close to the actual value. For instance, assume a series of data is obtained from the experiment as shown in a formula (8):

$$(R_i, X_i, S_i), i=1, \ldots, n \qquad (8).$$

In this regard, the error between the predicted value and the experimental value may be expressed as a polynomial fraction, as shown in a formula (9) below:

$$E_i = R_i + jX_i - \frac{(\beta_0 + \beta_1 S_i + \beta_2 S_i^2) + j(\beta_3 + \beta_4 S_i^2)}{1 + \alpha_2 S_i^2}, \qquad (9)$$
$$i = 1, \ldots, N.$$

The above formula (9) may be rewritten as a polynomial fraction as shown in a formula (10) below:

$$E_i' = [R_i(1+\alpha_2 S_i^2) - (\beta_0 + \beta_1 S_i + \beta_2 S_i^2)] + j[X_i(1+\alpha_2 S_i^2) - (\beta_3 + \beta_4 S_i^2)], i=1,\ldots,N \qquad (10).$$

When determining the optimal solution of the polynomial, the difference between the predicted value and the actual value may be calculated, and the sum of the squared absolute value of the difference may be calculated to generate a target function "E," as shown in a formula (11) below:

$$E = \sum_{i=1}^{N} |E'_i|^2 \qquad (11)$$

$$= \sum_{i=1}^{N} \{[R_i(1+\alpha_2 S_i^2) - (\beta_0 + \beta_1 S_i + \beta_2 S_i^2)]^2 + [X_i(1+\alpha_2 S_i^2) - (\beta_3 + \beta_4 S^2)]^2\}.$$

To determine the minimum value of the target function "E," the partial derivatives of the target function "E" may be determined and each partial derivative is set as zero, as expressed in formulas (12), (13), (14), (15), (16) and (17) below:

$$\frac{\partial E}{\partial \alpha_2} = 2\sum_{i=1}^{N} \left\{ \begin{array}{l} [R_i(1+\alpha_2 S_i^2) - (\beta_0 + \beta_1 S_i + \beta_2 S_i^2)](R_i S_i^2) + \\ [R_i X_i(1+\alpha_2 S_i^2) - (\beta_3 + \beta_4 S^2)](X_i S_i^2) \end{array} \right\} = 0. \qquad (12)$$

$$\frac{\partial E}{\partial \beta_0} = 2\sum_{i=1}^{N} \{[R_i(1+\alpha_2 S_i^2) - (\beta_0 + \beta_1 S_i + \beta_2 S_i^2)](-1)\} = 0. \qquad (13)$$

$$\frac{\partial E}{\partial \beta_1} = 2\sum_{i=1}^{N} \{[R_i(1+\alpha_2 S_i^2) - (\beta_0 + \beta_1 S_i + \beta_2 S_i^2)](-S_i)\} = 0. \qquad (14)$$

$$\frac{\partial E}{\partial \beta_2} = 2\sum_{i=1}^{N} \{[R_i(1+\alpha_2 S_i^2) - (\beta_0 + \beta_1 S_i + \beta_2 S_i^2)](-S_i^2)\} = 0. \qquad (15)$$

$$\frac{\partial E}{\partial \beta_3} = 2\sum_{i=1}^{N} \{[X_i(1+\alpha_2 S_i^2) - (\beta_3 + \beta_4 S_i^2)](-1)\} = 0. \qquad (16)$$

$$\frac{\partial E}{\partial \beta_4} = 2\sum_{i=1}^{N} \{[X_i(1+\alpha_2 S_i^2) - (\beta_3 + \beta_4 S_i^2)](-S_i)\} = 0. \qquad (17)$$

The above formulas (12), (13), (14), (15), (16) and (17) may be rewritten as formulas (18), (19), (20), (21), (22) and (23) below:

$$-\alpha_2 \sum_{i=1}^{N}(R_i S_i^2 + X_i S_i^2) + \beta_0 \sum_{i=1}^{N}(R_i S_i) + \beta_1 \sum_{i=1}^{N}(R_i S_i^2) + \beta_2 \sum_{i=1}^{N}(R_i S_i^4) + \beta_3 \sum_{i=1}^{N}(X_i S_i) + \beta_4 \sum_{i=1}^{N}(X_i S_i^4) = \beta_3 \sum_{i=1}^{N}(R_i^2 S_i^2 + X_i^2 S_i^2). \qquad (18)$$

$$-\alpha_2 \sum_{i=1}^{N}(R_i S_i^2) + \beta_0 \sum_{i=1}^{N}1 + \beta_1 \sum_{i=1}^{N}S_i + \beta_2 \sum_{i=1}^{N}S_i^2 = \sum_{i=1}^{N}R_i. \qquad (19)$$

$$-\alpha_2 \sum_{i=1}^{N}(R_i S_i^3) + \beta_0 \sum_{i=1}^{N}S_i + \beta_1 \sum_{i=1}^{N}S_i^2 + \beta_2 \sum_{i=1}^{N}S_i^3 = \sum_{i=1}^{N}R_i S_i. \qquad (20)$$

$$-\alpha_2 \sum_{i=1}^{N}(X_i S_i^4) + \beta_0 \sum_{i=1}^{N}S_i^2 + \beta_1 \sum_{i=1}^{N}S_i^3 + \beta_2 \sum_{i=1}^{N}S_i^4 = \sum_{i=1}^{N}R_i S_i^2. \qquad (21)$$

$$-\alpha_2 \sum_{i=1}^{N}(X_i S_i^4) + \beta_0 \sum_{i=1}^{N}1 + \beta_4 \sum_{i=1}^{N}S_i^2 = \sum_{i=1}^{N}X_i. \qquad (22)$$

$$-\alpha_2 \sum_{i=1}^{N}(X_i S_i^4) + \beta_3 \sum_{i=1}^{N}S_i^2 + \beta_4 \sum_{i=1}^{N}S_i^2 = \sum_{i=1}^{N}(X_i S_i^2). \qquad (23)$$

The formulas (18), (19), (20), (21), (22) and (23) may be expressed as a matrix (24) below:

$$AB = C \qquad (24)$$

$$A = \begin{bmatrix} -\sum_{i=1}^{N}(R_i^2 S_i^4 + X_i^2 S_i^4) & \sum_{i=1}^{N}R_i S_i^2 & \sum_{i=1}^{N}R_i S_i^3 & \sum_{i=1}^{N}R_i S_i^4 & \sum_{i=1}^{N}X_i S_i^2 & \sum_{i=1}^{N}X_i S_i^4 \\ -\sum_{i=1}^{N}R_i S_i^2 & \sum_{i=1}^{N}1 & \sum_{i=1}^{N}S_i & \sum_{i=1}^{N}S_i^2 & 0 & 0 \\ -\sum_{i=1}^{N}R_i S_i^3 & \sum_{i=1}^{N}S_i & \sum_{i=1}^{N}S_i^2 & \sum_{i=1}^{N}S_i^3 & 0 & 0 \\ -\sum_{i=1}^{N}R_i S_i^4 & \sum_{i=1}^{N}S_i^2 & \sum_{i=1}^{N}S_i^3 & \sum_{i=1}^{N}S_i^4 & 0 & 0 \\ -\sum_{i=1}^{N}X_i S_i^2 & 0 & 0 & 0 & \sum_{i=1}^{N}1 & \sum_{i=1}^{N}S_i^2 \\ -\sum_{i=1}^{N}X_i S_i^4 & 0 & 0 & 0 & \sum_{i=1}^{N}S_i^2 & \sum_{i=1}^{N}S_i^4 \end{bmatrix}$$

$$B = \begin{bmatrix} \alpha_2 & \beta_0 & \beta_1 & \beta_2 & \beta_3 & \beta_4 \end{bmatrix}^T$$

$$C = \begin{bmatrix} \sum_{i=1}^{N}(R_i^2 S_i^2 + X_i^2 S_i^2) & \sum_{i=1}^{N}R_i & \sum_{i=1}^{N}R_i S_i & \sum_{i=1}^{N}R_i S_i^2 & \sum_{i=1}^{N}X_i & \sum_{i=1}^{N}X_i S_i^2 \end{bmatrix}^T.$$

In the matrix (24) above, the matrix "B" may be transformed into a polynomial fraction through a proper matrix transformation, as shown in a formula (25) below:

$$B = A^{-1} C \quad (25).$$

In the formula (25) above, "B" is the coefficient matrix of the polynomial fraction, and $A^{-1}$ is the inverse matrix of the matrix "A."

Referring to FIG. 1, the parameter value outputting step S3 is configured to calculate the parameter values of an equivalent circuit based on the coefficients of the polynomial fraction, to calculate a moment of inertia and a friction coefficient of the induction machine based on the calculated parameter values of the equivalent circuit and the rotational speed signal, and to output the calculated moment of inertia and the friction coefficient. The detail is described below, but it is not taken as a limited sense.

For example, the above formula (7) includes five independent variables (Rs, Xs, Xm, Xr and Rr). However, this does not mean that every parameter of the equivalent circuit of the three-phase induction machine can be determined independently. In FIG. 2, the resistance of the equivalent circuit of the induction machine may be calculated according to the formula (2). Moreover, since the stator resistance Rs and the rotor resistance Rr are independent from each other, the reactance of the equivalent circuit of the induction machine may be calculated according to the formula (3). The reactance may consist of a constant reactance and a varying reactance that varies with the slip rate. The stator reactance and the magnetizing reactance may be combined as the constant reactance. The magnetizing reactance Xm, the rotor reactance Xr and the stator reactance Xs may have a relation as expressed in a formula (26) below:

$$\eta = \frac{X_m + X_r}{X_m + X_S}. \quad (26)$$

The predetermined ratio η may be between 0.95 and 1.05, and the formula (26) may be introduced into formula (7) to obtain a formula (27):

$$\frac{\alpha_2}{\alpha_2 \beta_3 - \beta_4} = \frac{(X_m + X_r)^2 / R_r^2}{X_m^2 (X_m + X_r) / R_r^2} = \frac{X_m + X_r}{X_m^2} = \frac{\eta \beta_3}{X_m^2}. \quad (27)$$

The formula (27) may be rewritten to obtain the expression of the magnetizing reactance Xm:

$$X_m = \sqrt{\frac{\eta \beta_3 (\alpha_2 \beta_3 - \beta_4)}{\alpha_2}}. \quad (28)$$

The stator reactance Xs, the rotor reactance Xr and the rotor resistance Rr may be expressed as formulas (29), (30) and (31), respectively:

$$X_S = \beta_3 - X_m \quad (29).$$

$$X_r = \eta(X_m + X_S) - X_m = \eta \beta_3 - X_m \quad (30).$$

$$R_r = X_m^2 / \beta_1 \quad (31).$$

The value of the stator resistance Rs may be calculated via an optimized ratio, as expressed below:

$$R_S = \frac{\beta_0 + \beta_2 S^2}{1 + \alpha_2 S^2}. \quad (32)$$

From formulas (6) and (32) above, the sum of the squared errors between the estimated value and the measured value of the stator resistance Rs may be expressed in a formula (33) below:

$$E_{R_S}^2 = \sum_{i=1}^{N} [R_S(1 + \alpha_2 S_i^2) - \beta_0 - \beta_2 S_i^2]^2. \quad (33)$$

If it is desired to set the sum of the squared errors $E_{R_s}^2$ in a minimum value, the stator resistance Rs may be expressed in a formula (34) below:

$$R_S = \frac{\sum_{i=1}^{N} [(1 + \alpha_2 S_i^2)(\beta_0 + \beta_2 S_i^2)]}{\sum_{i=1}^{N} (1 + \alpha_2 S_i^2)^2}. \quad (34)$$

The dynamic model of the three-phase induction machine may be expressed as formulas (35), (36), (37) and (38) below:

$$v_{qs} = (R_S + L_S p) i_{qs} + L_m p i_{qr} \quad (35).$$

$$v_{ds} = (R_S + L_S p) i_{ds} + L_m p i_{dr} \quad (36).$$

$$v_{qr} = L_m p i_{qs} - \omega_r L_m i_{ds} + (R_r + L_r p) i_{qr} - \omega_r L_r i_{dr} \quad (37).$$

$$v_{dr} = \omega_r L_m i_{qs} + L_m p i_{ds} + \omega_r L_r i_{qr} + (R_r + L_r p) i_{dr} \quad (38).$$

In formulas (35), (36), (37) and (38), $i_{qs}$ and $i_{ds}$ are the currents of the stator, $i_{qr}$ and $i_{dr}$ are the currents of the rotor, $v_{qs}$ and $v_{ds}$ are the voltages of the stator, $v_{qr}$ and $v_{dr}$ are the voltages of the rotor, and "p" is the differential factor. Based on this, the output torque may be calculated as a formula (39) below:

$$T = 3PL_m(i_{dr} i_{qs} - i_{qr} i_{ds}) \quad (39).$$

In the formula (39), "p" is the number of the poles.

Furthermore, since the moment of inertia "J" and the friction coefficient "B" determine the relationship between the output rotational torque and the rotational speed of the induction machine, the moment of inertia and the friction coefficient can be obtained when the output rotational torque and the rotational speed are known. Assume the torsional force generated by the induction machine results in a change in only the rotational speed and does not drive any other mechanical load; in this case, the rotational speed can be expressed by a differential equation (40) below:

$$J\dot{\omega} + B\omega = T \quad (40).$$

In the equation (40) above, "J" is the moment of inertia and "B" is the friction coefficient. $\dot{\omega}$ and ω are the angular acceleration and the angular velocity, respectively. "T" is the rotational torque. The equation (40) may be expressed in a discrete manner, as shown in a formula (41) below:

$$J(\omega(n) - \omega(n-1)) + B\omega(n) = T(n), n = 0, 1, \ldots \quad (41).$$

In the formula (41) above, "n" is the serial number of the discrete data. ω(n) and ω(n−1) are the angular velocities at different discrete time frames. T(n) is a discrete rotational torque.

In addition, when the system is a linear system, the moment of inertia and the friction coefficient remain unchanged. In this regard, a target function may be set to obtain the optimal parameter values, as expressed in a formula (42) below.

$$E_T = \sum_{n=0}^{N-1} (T(n) - J[\omega(n) - \omega(n-1)] - B\omega(n))^2. \quad (42)$$

When the target function is in a minimum value, the optimal values of the moment of inertia "J" and the friction coefficient "B" are obtained. Namely, the gradients of the moment of inertia "J" and the friction coefficient "B" in the formula (42) are set as zero, then "J" and "B" may be obtained from a formula (43) below:

$$\begin{bmatrix} J \\ B \end{bmatrix} = \begin{bmatrix} \sum_{n=0}^{N-1}(\omega_r(n) - \omega_r(n-1))^2 & \sum_{n=0}^{N-1}\omega_r(n)(\omega_r(n) - \omega_r(n-1)) \\ \sum_{n=0}^{N-1}\omega_r(n)(\omega_r(n) - \omega_r(n-1)) & \sum_{n=0}^{N-1}(\omega_r(n))^2 \end{bmatrix}^{-1} \begin{bmatrix} \sum_{n=0}^{N-1}T(n)(\omega_r(n) - \omega_r(n-1)) \\ \sum_{n=0}^{N-1}T(n)\omega_r(n) \end{bmatrix}. \quad (43)$$

In the formula (43) above, $\omega_r(n)$ and $\omega_r(n-1)$ are the angular velocity at different discrete time frames.

TABLE 1

The Coefficients of the Polynomial Fraction and the Parameter Values of the Induction Machine

| The Coefficients of the Polynomial Fraction | The Parameters of the Induction Machine | | |
|---|---|---|---|
| | η = 0.95 | η = 1.00 | η = 1.05 |
| α2 = 64.6 | Xm = 280.7 | Xm = 280.0 | Xm = 295.1 |
| β0 = 38.0 | $X_S$ = 24.3 | $X_S$ = 17.0 | $X_S$ = 9.88 |
| B1 = 6912.0 | Xr = 9.0 | Xr = 17.0 | Xr = 25.1 |
| B2 = 24548.2 | $R_S$ = 38.0 | $R_S$ = 38.0 | $R_S$ = 38.0 |
| B3 = 305.0 | Rr = 11.4 | Rr = 12.0 | Rr = 12.6 |
| B4 = 21352.1 | | | |

Figure 4:
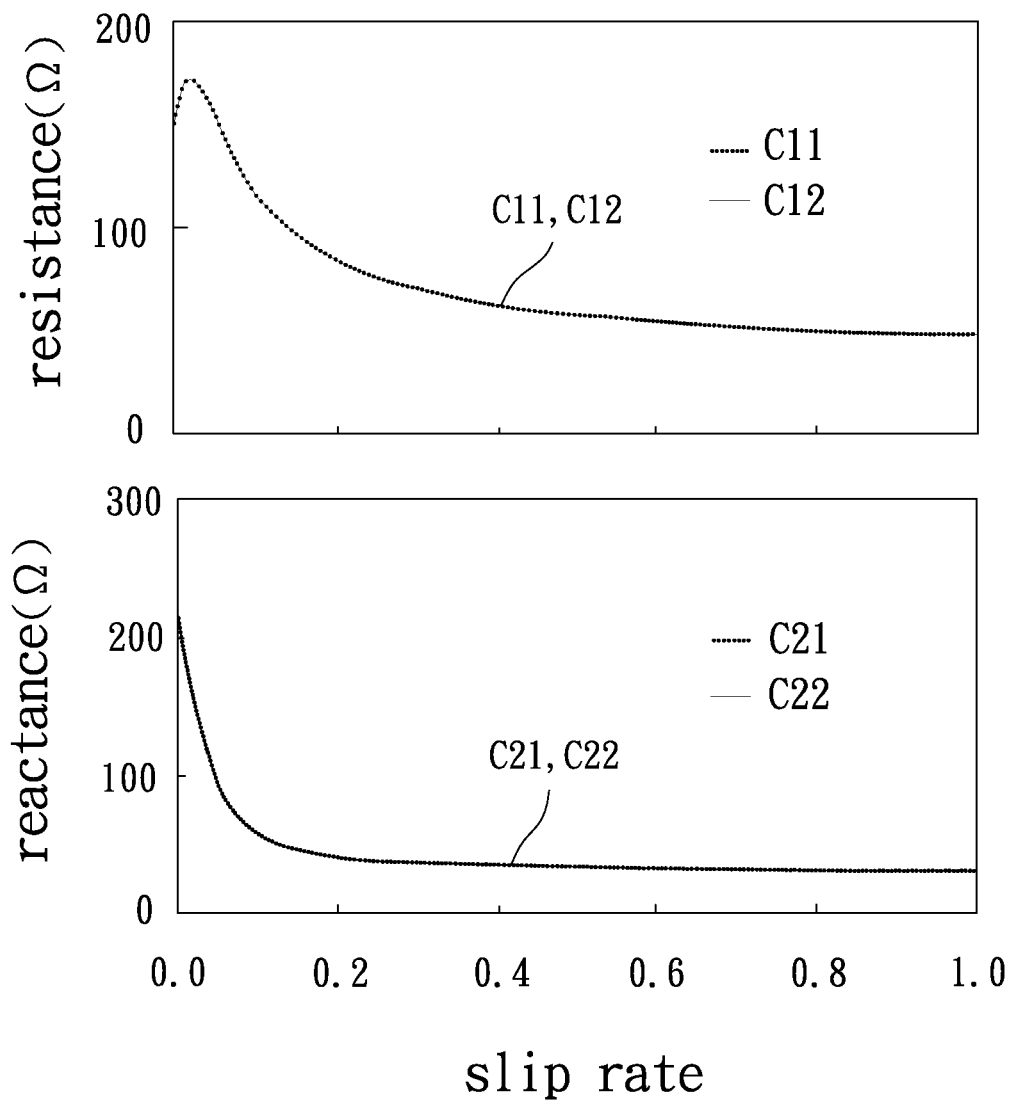
FIG. 4 shows a simulated impedance relation curve and an actual impedance relation curve under the same sampling slip rate.

To verify the reliability of the method of the embodiment of the invention, a three-phase induction machine (e.g. 4 poles, 0.5 hp, and 60 Hz) may be exemplarily used. In this regard, referring to the equivalent circuit in FIG. 2, it can be calculated that the stator resistance Rs is 38Ω, the rotor resistance Rr is 12Ω, the magnetizing reactance Xm is 288Ω, the stator reactance Xs is 17Ω, and the rotor reactance Xr is 17Ω. The coefficients of the polynomial fraction and the parameter values of the induction machine may be obtained from the above formulas. As shown in Table 1 above, the method of the embodiment of the invention simply requires one-off calculation procedure to determine the optimal values of the parameters of the induction machine. In this regard, the predetermined ratio η is dependent on the values of the Xm, Xs and Xr, in which the values of the Xm, Xs and Xr depend from each other. The simulated impedance relation curve should be consistent with the actual impedance relation curve irrespective of whether the change of the predetermined ratio η is small or large. As such, a simulation software (such as SPICE) may be used to draw the relation curves of the resistance and the reactance. It can be recognized from FIG. 4 that the simulated resistance relation curve C11 completely matches the actual resistance relation curve C12, and that the simulated reactance relation curve C21 also completely matches the actual reactance relation curve C22. Thus, it is proven that the method of the embodiment of the invention has a high reliability.

TABLE 2

The Coefficients of a Polynomial Fraction and the Parameter Values of the Induction Machine

| The Coefficients of the Polynomial Fraction | The Parameter Values of the Induction Machine (Ω) |
|---|---|
| α2 = 850.0 | $X_m$ = 291.0 |
| β0 = 38.8 | $X_S$ = 17.2 |
| B1 = 6968.3 | $X_r$ = 17.2 |
| B2 = 21652.4 | $R_S$ = 26.0 |
| B3 = 308.2 | $R_r$ = 12.1 |
| B4 = 28468.6 | |

Figure 5:
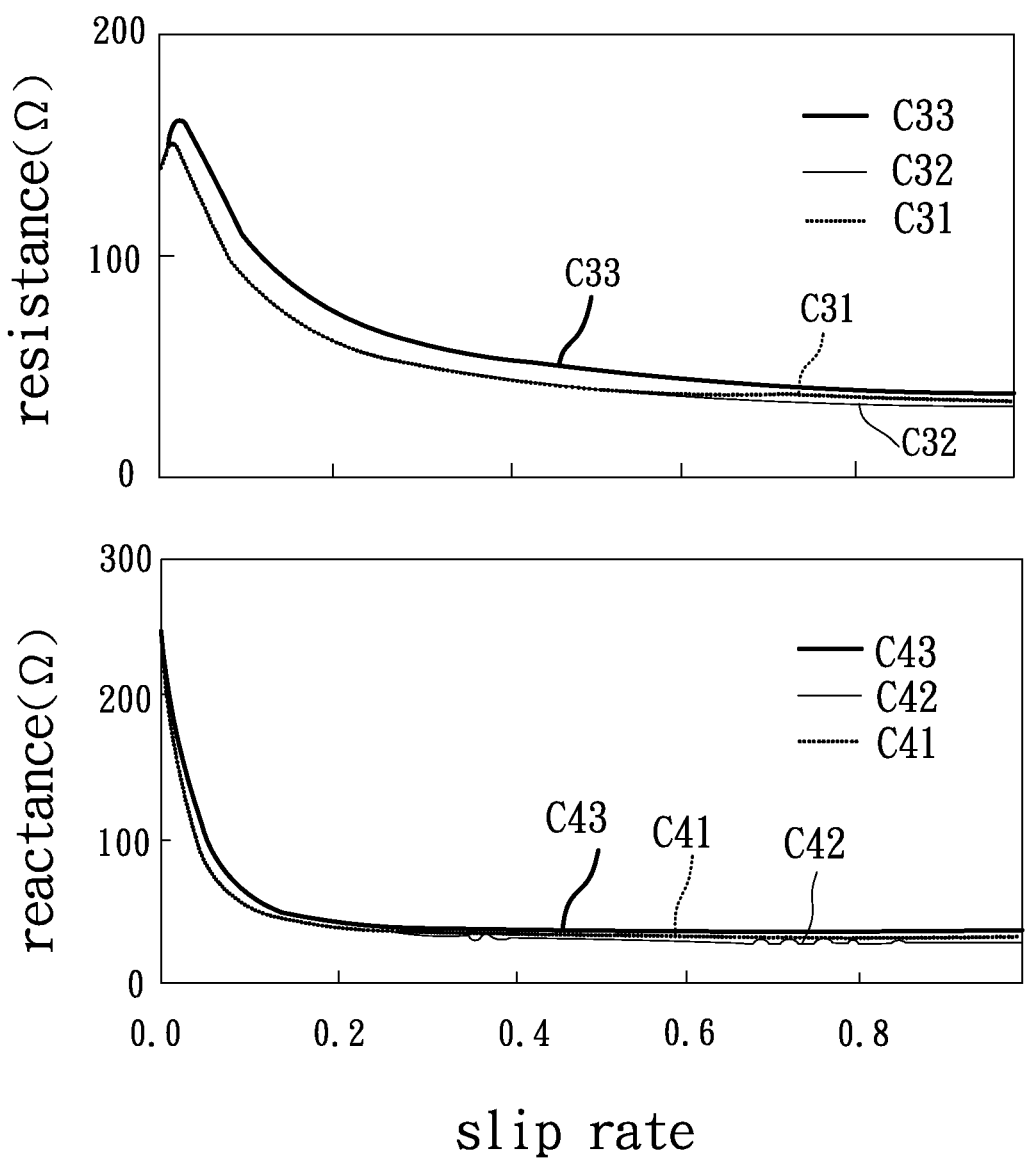
FIG. 5 shows the relation curves of the resistance and the reactance.

After measuring the parameter values of the three-phase induction machine, the coefficients of the polynomial fraction are obtained as Table 2 above. In addition, the relation curves of the resistance and the reactance are shown in FIG. 5. From FIG. 5, it can be recognized that the simulated resistance relation curve C31 using the determined coefficients of the polynomial fraction has a high level of consistence with the actual resistance relation curve C32 of the polynomial fraction, and that the simulated reactance relation curve C41 using the determined coefficients of the polynomial fraction has a high level of consistence with the actual reactance relation curve C42 of the polynomial fraction. In this regard, if the predetermined ratio η is set as 1, the values of the parameters of the induction machine are obtained as Table 2. In FIG. 5, although both the simulated resistance relation curve C33 and the simulated reactance relation curve C34 of the induction machine have some errors (resulting from some unexpected nonlinear component in the signals or resulting from other interference), the method of the embodiment of the invention still achieves the most approximate result.

Figure 6:
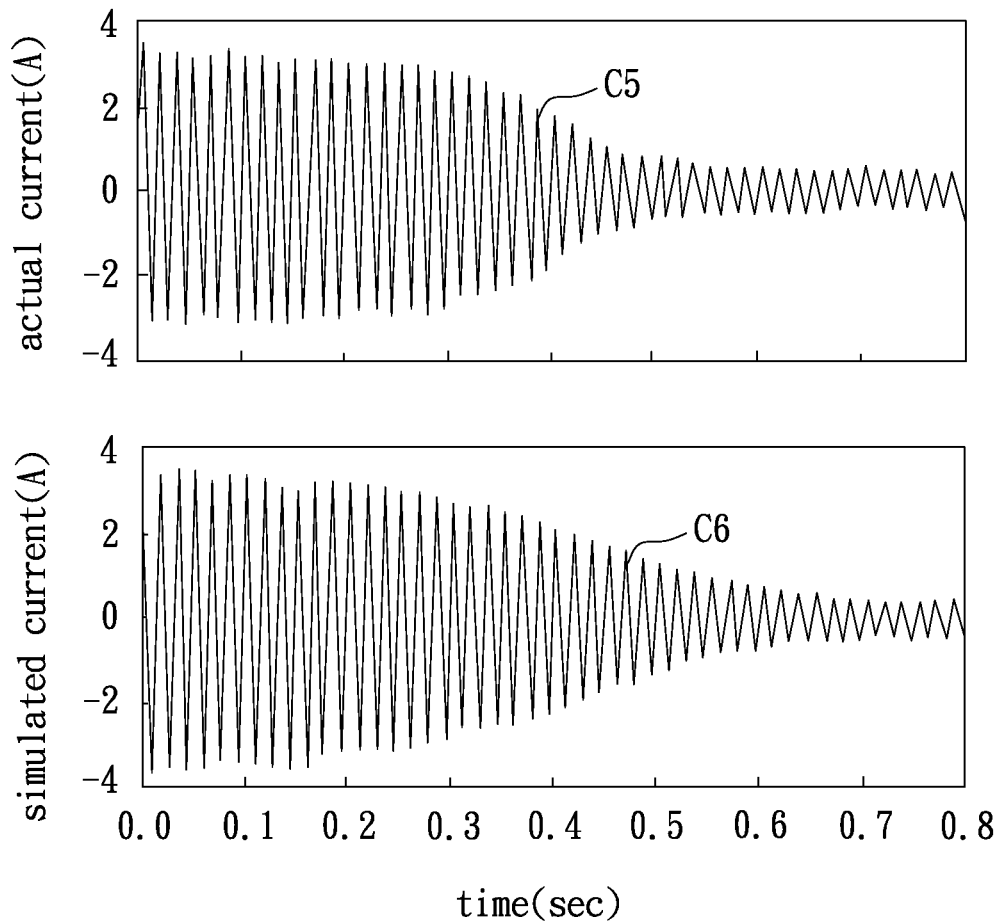
FIG. 6 shows a simulated current relation curve of the induction machine using the parameter values obtained from the method of the invention, as well as an actual current relation curve of the induction machine.

Besides, the parameter values in Table 2 are used to simulate the dynamic behavior of the system, and the simulated result may be compared with the actual result. Specifically, a simulated current relation curve C6 is generated using the values in Table 2, and is compared with the actual current relation curve C5. It can be observed that the actual current relation curve C5 is very close to the simulated current relation curve C6. Thus, the current patterns in FIG. 6 will appear to be in a steady state. Therefore, it is proven that the change of current is primarily affected by the steady state term. Furthermore, a standard test may be performed to determine the values of the parameters, and the determined parameter values may also be used to simulate the dynamic behavior of the system. However, the generated result is less accurate than that generated by the method of the embodiment of the invention. It is noted that in the standard test, the data of two operational conditions (the lock-rotor test and the off-load test) are used as reference for determining the values of the parameters. In this regard, since the measured signals always contain some error or often experience interference, the determined parameter values will inevitably have some errors caused thereby. To obtain the accurate parameter values, the error must be reduced to a minimum extent. In light of this, the method of the embodiment of the invention may be used to reduce the error to a minimum extent via the polynomial calculations.

Figure 7:
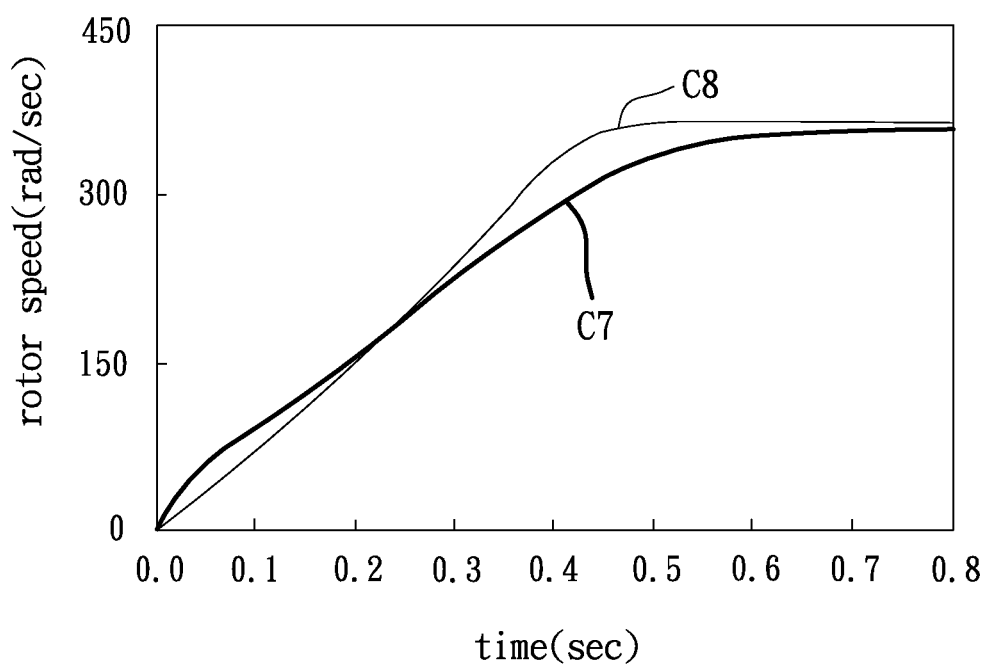
FIG. 7 shows a simulated relation curve of a rotational speed of the induction machine using the parameter values obtained from the method of the invention, as well as an actual relation curve of the rotational speed of the induction machine.

FIG. 7 shows a simulated relation curve of a rotational speed of the induction machine using the parameter values obtained from the method of the embodiment of the invention, as well as an actual relation curve of the rotational speed of the induction machine. It can be obtained from the formula (43) that the rotational moment of inertia "J" of the induction machine is 0.38 (g·m$^2$), and that the friction coefficient "B" of said machine is 0.61 (mN·m/(rad/sec)). Accordingly, the target function "Er" in formula (42) is 8.388 (rad/sec), which is very small. Moreover, it can be observed from FIG. 7 that the actual relation curve of the rotational speed C7 is close to the simulated relation curve of the rotational speed C8. Therefore, it is proven that the method of the embodiment of the invention is able to determine the parameter values approximate to the actual values. Advantageously, the determined parameter values will have high accuracy.

Based on the above, the method of the embodiment of the invention is able to calculate the resistance and the reactance of the induction machine under different slip rates based on the time-varying voltage, current and rotational speed signals of the induction machine generated at the time the induction machine is started. The method also calculates the coefficients of the polynomial fraction based on the resistance and the reactance, calculates the parameter values of the equivalent circuit based on the coefficients of the polynomial fraction, calculates the moment of inertia and the friction coefficient based on the calculated parameter values of the equivalent circuit and the rotational speed signal, and finally outputs the values of the moment of inertia and the friction coefficient. The values of the moment of inertia and the friction coefficient may be outputted to a display, a database, a storage device, a computer or the like.

Through the above steps, the method of the embodiment of the invention does not need to determine the parameter values in a no-load low-voltage manner and does not require the initial value. Besides, the method of the embodiment of the invention is able to obtain the optimal values via one-off calculation procedure. Thus, the calculation complexity can be reduced, and the calculated parameter values will have high reliability and accuracy. As such, the disadvantages of the conventional method, such as the use of an initial value, the need to perform the method in a no-load low-voltage manner, as well as high calculation complexity, can be overcome. Accordingly, the user is able to predict the parameter values and the operational condition of the induction machine, improving the reliability and accuracy of the precision control technology.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. A method for determining parameter values of an induction machine by means of polynomial calculations, as performed by a dedicated computer system, comprising:

sampling a voltage signal, a current signal and a rotational speed signal of the induction machine at a time the induction machine is started;

calculating a resistance and a reactance of the induction machine at each of a plurality of slip rates according to the voltage signal and the current signal;

calculating a plurality of coefficients of a polynomial fraction based on the resistances and the reactances;

calculating parameter values of an equivalent circuit according to the plurality of coefficients of the polynomial fraction, wherein the equivalent circuit comprises a stator resistance, a stator reactance and a magnetizing reactance that are connected in series to form an open loop, and wherein the equivalent circuit further comprises a rotor reactance and a rotor resistance that are connected to two ends of the magnetizing reactance to form a closed loop;

calculating a moment of inertia and a friction coefficient of the induction machine according to the calculated parameter values and the rotational speed signal of the equivalent circuit; and outputting the moment of inertia and the friction coefficient of the induction machine, wherein the polynomial fraction is expressed as:

$$R + jX = \frac{(\beta_0 + \beta_1 S + \beta_2 S^2) + j(\beta_3 + \beta_4 S^2)}{1 + \alpha_2 S^2},$$

wherein, $\alpha_2 = (X_m + X_r)^2/R_r^2$ $\beta_0 = R_S$ $\beta_1 = X_m^2/R_r$ $\beta_2 = R_S(X_m + X_r)^2/R_r^2$ $\beta_3 = X_m + X_S$ $\beta_4 = [(X_m + X_r)^2(X_m + X_S) - X_m^2(X_m + X_r)]$ wherein "R" is the resistance of a primary side of the induction machine, "X" is the reactance of the primary side of the induction machine, "S" is the slip rates, "Xm" is the magnetizing reactance, "Xr" is the rotor reactance, "Xs" is a stator reactance, "Rr" is the rotor resistance, and "Rs" is the stator resistance.

2. The method for determining the parameter values of the induction machine by means of polynomial calculations as claimed in claim 1, wherein the magnetizing reactance, the rotor reactance and the stator reactance have a predetermined ratio η below:

$$\eta = \frac{X_m + X_r}{X_m + X_S}.$$

3. The method for determining the parameter values of the induction machine by means of polynomial calculations as claimed in claim 2, wherein the predetermined ratio is between 0.95 and 1.05.

4. The method for determining the parameter values of the induction machine by means of polynomial calculations as claimed in claim 2, wherein the magnetizing reactance is expressed as:

$$X_m = \sqrt{\frac{\eta\beta_3(\alpha_2\beta_3 - \beta_4)}{\alpha_2}}.$$

5. The method for determining the parameter values of the induction machine by means of polynomial calculations as claimed in claim 2, wherein the stator reactance is expressed as:

$$X_S = \beta_3 - X_m.$$

6. The method for determining the parameter values of the induction machine by means of polynomial calculations as claimed in claim 2, wherein the rotor reactance is expressed as:

$$X_r = \eta(X_m + X_S) - X_m = \eta\beta_3 - X_m.$$

7. The method for determining the parameter values of the induction machine by means of polynomial calculations as claimed in claim 2, wherein the rotor resistance is expressed as:

$$R_r = X_m^2/\beta_1.$$

8. The method for determining the parameter values of the induction machine by means of polynomial calculations as claimed in claim 2, wherein the stator resistance is expressed as:

$$R_S = \frac{\beta_0 + \beta_2 S^2}{1 + \alpha_2 S^2}.$$

9. A method for determining parameter values of an induction machine by means of polynomial calculations, as performed by a dedicated computer system, comprising:

sampling a voltage signal, a current signal and a rotational speed signal of the induction machine at a time the induction machine is started;

calculating a resistance and a reactance of the induction machine at each of a plurality of slip rates according to the voltage signal and the current signal;

calculating a plurality of coefficients of a polynomial fraction based on the resistances and the reactances;

calculating parameter values of an equivalent circuit according to the plurality of coefficients of the polynomial fraction;

calculating a moment of inertia and a friction coefficient of the induction machine according to the calculated parameter values and the rotational speed signal of the equivalent circuit; and outputting the moment of inertia and the friction coefficient of the induction machine, wherein the moment of inertia and the friction coefficient are expressed as:

$$\begin{bmatrix} J \\ B \end{bmatrix} = \begin{bmatrix} \sum_{n=0}^{N-1}(\omega_r(n) - \omega_r(n-1))^2 & \sum_{n=0}^{N-1}\omega_r(n)(\omega_r(n) - \omega_r(n-1)) \\ \sum_{n=0}^{N-1}\omega_r(n)(\omega_r(n) - \omega_r(n-1)) & \sum_{n=0}^{N-1}(\omega_r(n))^2 \end{bmatrix}^{-1},$$

$$\begin{bmatrix} \sum_{n=0}^{N-1} T(n)(\omega_r(n) - \omega_r(n-1)) \\ \sum_{n=0}^{N-1} T(n)\omega_r(n) \end{bmatrix}$$

wherein ω(n) and ω(n−1) are angular velocities at different discrete time frames, wherein T (n) is a discrete rotational torque, and wherein "n" is a serial number of discrete data.

* * * * *